United States Patent [19]

Strack

[11] Patent Number: 5,087,577
[45] Date of Patent: Feb. 11, 1992

[54] MANUFACTURING METHOD FOR A POWER MISFET

[75] Inventor: Helmut Strack, Munich, Fed. Rep. of Germany

[73] Assignee: Siemens Aktiengesellschaft, Munich, Fed. Rep. of Germany

[21] Appl. No.: 710,588

[22] Filed: Jun. 5, 1991

[30] Foreign Application Priority Data

Jun. 5, 1990 [EP] European Pat. Off. ........ 90110611.2

[51] Int. Cl.⁵ .......................................... H01L 21/335
[52] U.S. Cl. ...................................... 437/29; 437/40; 437/41; 437/203; 437/228; 148/DIG. 126
[58] Field of Search ..................... 437/29, 40, 41, 203, 437/228, 235; 148/DIG. 126; 357/23.4

[56] References Cited

U.S. PATENT DOCUMENTS

| | | | |
|---|---|---|---|
| 4,055,884 | 11/1977 | Jambotkar | 29/571 |
| 4,199,774 | 4/1980 | Plummer | 357/23.4 |
| 4,613,883 | 9/1986 | Tihanyi | 357/23.4 |
| 4,918,026 | 4/1990 | Kosiak et al. | 357/23.4 |

FOREIGN PATENT DOCUMENTS

| | | |
|---|---|---|
| 0227894 | 7/1987 | European Pat. Off. . |
| 0241059 | 10/1987 | European Pat. Off. . |
| 0083077 | 7/1981 | Japan . |
| 2087648 | 5/1982 | United Kingdom . |

OTHER PUBLICATIONS

Japan Patent Disclosure, Nov. 12, 1986, vol. 10, No. 332, "Semiconductor Device", Tetsuo Iijima.

*Primary Examiner*—Brian E. Hearn
*Assistant Examiner*—Tom Thomas
*Attorney, Agent, or Firm*—Hill, Van Santen, Steadman & Simpson

[57] ABSTRACT

A manufacturing method for a low-voltage power MISFET which utilizes three maskes (photosteps) is provided. In the first step, a polysilicon layer is structured and a cell field and edge zones are manufactured. An oxide layer is then applied, this being opened in the second photostep above the cells and the edge zones and between the edge and the cells. A metal layer is then applied, this being interrupted between the cells and the edge zones with the third photostep. Field plates and a channel stopper are thus produced.

6 Claims, 1 Drawing Sheet

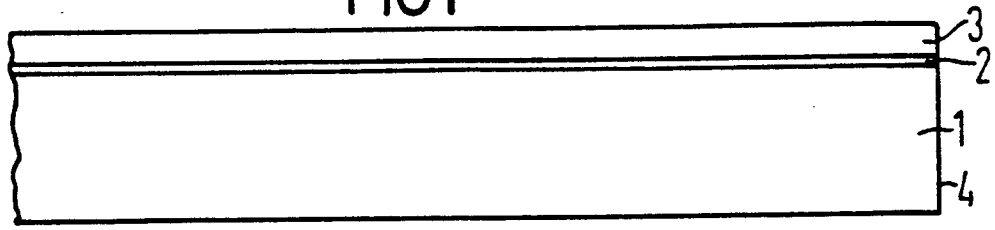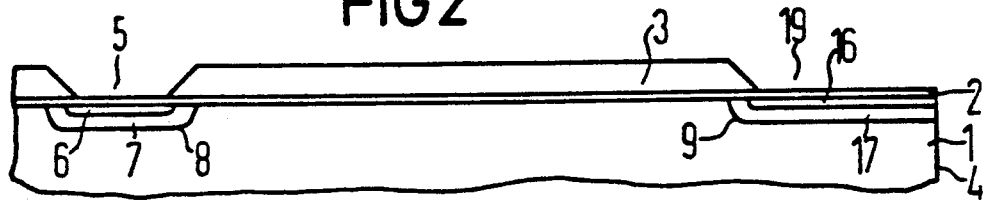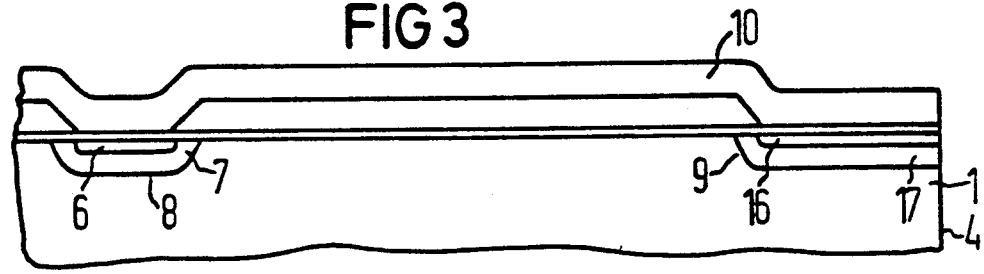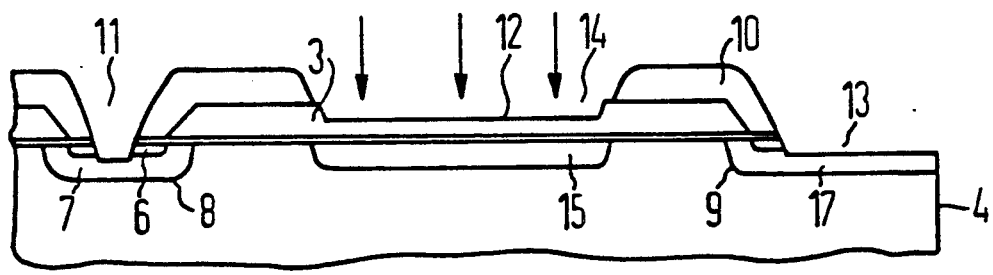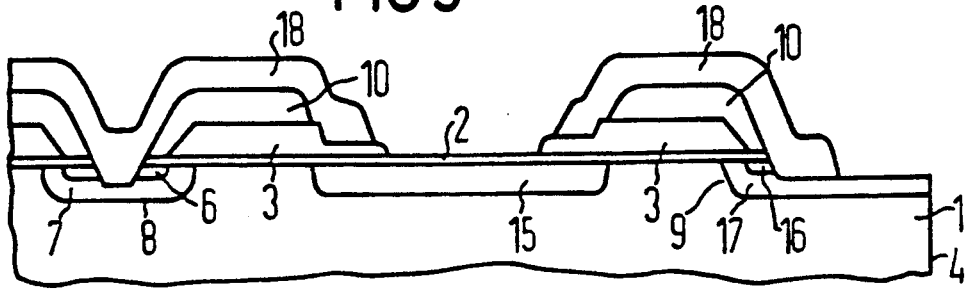

MANUFACTURING METHOD FOR A POWER MISFET

BACKGROUND OF THE INVENTION

The invention is directed to a method for manufacturing a power MISFET having a semiconductor body that comprises a field of transistor cells as well as at least one field plate and at least one channel stopper.

Methods for manufacturing such MISFETs are standard practice. At least four, but usually five or more, photosteps are thus required in order to produce the fine structures of such a power MISFET. A mask is required for every photostep. A significant reduction in the manufacturing costs can only be achieved by reducing the number of photosteps.

SUMMARY OF THE INVENTION

An object of the invention is to specify a method that is employable for a low-voltage power MISFET that manages with only three photosteps.

This method is characterized by the steps:
a) the semiconductor body is covered with a first oxide layer;
b) the first oxide layer is covered with a polysilicon layer;
c) the polysilicon layer is structured with a first photostep;
d) the transistor cells and edge zones lying above one another are produced;
e) the semiconductor body is covered with a second oxide layer;
f) with a second photostep, through holes or a contact region, respectively, are produced in the second oxide layer in the region of the transistor cells and the edge zones, and an annular depression which surrounds the transistor cells is produced in the polysilicon layer between the transistor cells and the edge zones;
g) dopants are implanted through the depression into the semiconductor body, these dopants having the conductivity type opposite that of the semiconductor body and having a dose that is lower than the dose employed for the transistor cells and for the edge zones;
h) the semiconductor body is covered with a metal layer; and
i) the metal layer and the polysilicon layer are completely interrupted in the region of the annular depression on the basis of a third photostep.

BRIEF DESCRIPTION OF THE DRAWINGS

FIGS. 1 through 5 are fragmentary side views showing various steps in a method for manufacturing a power MISFET according to the inventive method disclosed herein.

DESCRIPTION OF THE PREFERRED EMBODIMENTS

A semiconductor body is shown in FIG. 1 and is referenced 1. For example, it is weakly n-conductive. The semiconductor body is covered with an oxide layer 2 that is employed as a gate oxide. Subsequently, the layer 2 is covered with a polysilicon layer 3.

The polysilicon layer 3 is structured in a first photostep, whereby openings 5 for the transistor cells and an opening 19 for the channel stopper lying at the edge arise (FIG. 2). These openings have slanting side walls, so that the polysilicon layer 3 can serve as a mask for producing the source zones 6 and the base zones 7 or the zones 16, 17, respectively, lying above one another in the channel stopper 9 lying at the edge 4. Such zones 6, base zones 7, and zones 16, 17 are produced in a known way by, for example, implanting arsenic or phosphorus ions and boron ions, respectively. The energy of the boron ions is thereby higher, so that these also penetrate through the slanting part of the polysilicon layer 3 employed as a mask and penetrate more deeply into the semiconductor body 1. Transistor cells 8 and the zones 16, 17 are produced in this step.

As a next step (FIG. 3), a second oxide layer 10 is applied which is thicker by a multiple than the oxide layer 2. The oxide layer 10 covers the entire surface of the semiconductor body 1. In a second photostep, the second oxide layer 10 is structured. It is opened such that in the region of the transistor cells 8 and of the zones 16, 17, through holes 11 or a contact region 13 arise, these extending up to the base zones 7 or up to the edge zone 17, respectively. In the same photostep, an opening 14 that annularly surrounds the transistor cells 8 is produced in the second oxide layer 10 between the transistor cells 8 and the edge zones. The same etching process which opens the through holes 11 and the contact region 13 down to the surface of the base zone 7 or of the edge zone 17, respectively, also etches an annular depression 12 into the polysilicon layer 3. Subsequently, boron ions, for example, are implanted into the surface of the semiconductor body, these boron ions producing an annular zone 15 having a conductivity type opposite that of the semiconductor body. The dose which is applied is lower than that for producing the source zone 6 and the base zone 7 or the edge zones 16, 17, respectively. The doping of the transistor cells in the region of the through hole is therefore only insignificantly modified. The surface of the semiconductor body between the zone 15 and the transistor cells, moreover, is shielded from the implantation of ions by the oxide layer 10 (FIG. 4).

Subsequently, a metal layer 18 of, for example, aluminum, is applied onto the surface of the semiconductor body. This layer forms the source contacts for the transistor cells 8 and creates the indispensable shunts between the source zones 6 and the base zones 7 for a power MISFET. The metal layer 18 contacts the edge zones 16, 17 in the region of the channel stopper 9. In a third and last photostep, the polysilicon layer 3 and the metal layer 18 are completely interrupted above the zone 15 (FIG. 5). Subsequently, the entire surface can also be covered with a passivation layer of, for example, silicon nitride. This step is not shown in the figures.

According to an alternative, the ion implantation shown in FIG. 4 can also be postponed until after the interruption of the polysilicon layer and of the metal layer 16 (FIG. 5). The metal layer 18 then acts as a mask.

The metal layer 18 connected to the transistor cells 8 acts as a field plate together with that part of the polysilicon layer 3 connected to it. The metal layer 18 connected to the edge zones 16, 17 acts as a channel stopper electrode, in combination with the polysilicon layer 3 connected to it. Since the pn-junction limiting the edge zone 17 is very poor due to its position at the edge and as a consequence of mechanical parting processes, for example sawing, a relatively good contact is established here between the channel stopper and the substrate of the semiconductor body 1. For the same reason, the zone 16 also does not act as a source zone. The zone 15 acts as a guard ring and lies at floating potential.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for manufacturing a power MISFET with a semiconductor body which comprises a field of transistor cells as well as at least one field plate and at least one channel stopper, comprising the steps of:
    covering the semiconductor body with a first oxide layer;
    covering the first oxide layer with a polysilicon layer;
    structuring the polysilicon layer with a first photostep;
    producing the transistor cells and producing edge zones lying above one another for the channel stopper;
    covering the semiconductor body with a second oxide layer;
    with a second photostep, producing through holes in the second oxide layer in a region of the transistor cells and producing an opening for contact regions at the edge zones in the second oxide layer, and producing an annular depression which surrounds the transistor cells in the polysilicon layer between the transistor cells and the edge zones;
    implanting dopants which have a conductivity type opposite that of the semiconductor body into the semiconductor body through the depression with a dose which is lower than a dose employed for the transistor cells and for the edge zones;
    covering the semiconductor body with a metal layer; and
    with a third photostep, completely interrupting the metal layer and the polysilicon layer in a region of the annular depression.

2. A method according to claim 1 wherein the semiconductor body is covered with a passivation layer following the step of interrupting the metal layer and the polysilicon layer.

3. A method for manufacturing a power MISFET with a semiconductor body which comprises a field of transistor cells as well as at least one field plate and at least one channel stopper, comprising the steps of:
    covering the semiconductor body with a first oxide layer;
    covering the first oxide layer with a polysilicon layer;
    structuring the polysilicon layer with a first photostep;
    producing the transistor cells and producing edge zones lying above one another for the channel stopper;
    covering the semiconductor body with a second oxide layer;
    with a second photostep, producing through holes in the second oxide layer in a region of the transistor cells and producing an opening for a contact region at the edge zones in the second oxide layer, and producing an annular depression which surrounds the transistor cells in the polysilicon layer between the transistor cells and the edge zones;
    covering the semiconductor body with a metal layer;
    with a third photostep, completely interrupting the metal layer and the polysilicon layer in a region of the annular depression; and
    implanting dopants which have a conductivity type opposite that of the semiconductor body into the semiconductor body through the depression with a dose which is lower than a dose employed for the transistor cells and for the edge zones.

4. A method according to claim 3 wherein the semiconductor body is covered with a passivation layer after the step of implanting the dopants in the semiconductor body through the depression.

5. A method for manufacturing a power MISFET with a semiconductor body which comprises a field of transistor cells as well as at least one field plate and at least one channel stopper, comprising the steps of:
    covering the semiconductor body with a first oxide layer;
    covering the first oxide layer with a polysilicon layer;
    structuring the polysilicon layer with a first photostep;
    producing the transistor cells and producing edge zones for the channel stopper;
    covering the semiconductor body with a second oxide layer;
    with a second photostep, producing through holes in the second oxide layer in a region of the transistor cells and producing an opening for contact regions at the edge zones in the second oxide layer, and producing a depression which surrounds the transistor cells in the polysilicon layer;
    implanting dopants which have a conductivity type opposite that of the semiconductor body into the semiconductor body through the depression;
    covering the semiconductor body with a metal layer; and
    with a third photostep, interrupting the metal layer and the polysilicon layer in a region of the depression.

6. A method for manufacturing a power MISFET with a semiconductor body which comprises a field of transistor cells as well as at least one field plate and at least one channel stopper, comprising the steps of:
    covering the semiconductor body with a first oxide layer;
    covering the first oxide layer with a polysilicon layer;
    structuring the polysilicon layer with a first photostep;
    producing the transistor cells and producing edge zones for the channel stopper;
    covering the semiconductor body with a second oxide layer;
    with a second photostep, producing through holes in the second oxide layer in a region of the transistor cells and producing an opening for a contact region at the edge zones in the second oxide layer, and producing a depression which surrounds the transistor cells in the polysilicon layer;
    covering the semiconductor body with a metal layer;
    with a third photostep, interrupting the metal layer and the polysilicon layer in a region of the depression; and
    implanting dopants which have a conductivity type opposite that of the semiconductor body into the semiconductor body through the depression.

* * * * *